United States Patent
Hsu et al.

(10) Patent No.: US 7,737,391 B2
(45) Date of Patent: Jun. 15, 2010

(54) METHOD FOR INDEPENDENTLY DETECTING SIGNALS IN A DOUBLE-JUNCTION FILTERLESS CMOS COLOR IMAGER CELL

(75) Inventors: Sheng Teng Hsu, Camas, WA (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 399 days.

(21) Appl. No.: 11/805,003

(22) Filed: May 22, 2007

(65) Prior Publication Data

US 2007/0215921 A1    Sep. 20, 2007

Related U.S. Application Data

(60) Division of application No. 11/499,081, filed on Aug. 4, 2006, now Pat. No. 7,233,036, which is a continuation-in-part of application No. 11/416,742, filed on May 3, 2006, which is a continuation-in-part of application No. 11/384,110, filed on Mar. 17, 2006, now Pat. No. 7,419,844.

(51) Int. Cl.
*G01J 1/44* (2006.01)
*H04N 3/14* (2006.01)

(52) U.S. Cl. .................. 250/214 R; 348/308; 250/208.1

(58) Field of Classification Search ............. 250/214 R, 250/208.1; 257/290, 292; 348/308
See application file for complete search history.

(56) References Cited

OTHER PUBLICATIONS

Findlater K.M. et al., "Buried double junction pixel using green and magenta filters", IEEE Workshop on CCDs & Advanced Image Sensors, Karuizawa, Nagano Japan, pp. 6.1-6.4, Jun. 1999.*

* cited by examiner

*Primary Examiner*—Thanh X Luu
(74) *Attorney, Agent, or Firm*—Law Office of Gerald Maliszewski; Gerald Maliszewski

(57) ABSTRACT

A double-junction complimentary metal-oxide-semiconductor (CMOS) filterless color imager cell is provided. The imager cell is fabricated from a silicon-on-insulator (SOI) substrate including a silicon (Si) substrate, a silicon dioxide insulator overlying the substrate, and a Si top layer overlying the insulator. A photodiode set is formed in the SOI substrate, including a first and second photodiode formed as a double-junction structure in the Si substrate. A third photodiode is formed in the Si top layer. A (imager sensing) transistor set is formed in the top Si layer. The transistor set is connected to the photodiode set and detects an independent output signal for each photodiode. The transistor set may be an eight-transistor (8T), a nine-transistor (9T), or an eleven-transistor (11T) cell.

7 Claims, 8 Drawing Sheets

$T_B$: TRANSFER TRANSISTOR FOR BLUE COLOR SENSING DIODE
$T_G$: TRANSFER TRANSISTOR FOR GREEN COLOR SENSING DIODE
$T_R$: TRANSFER TRANSISTOR FOR RED COLOR SENSING DIODE

Fig. 2B
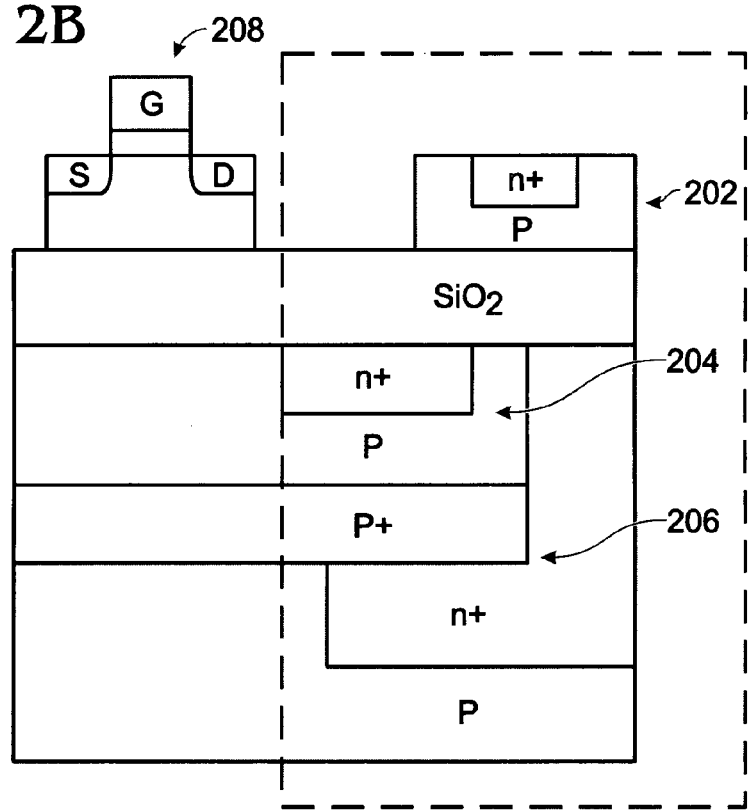
Fig. 3 *(PRIOR ART)*
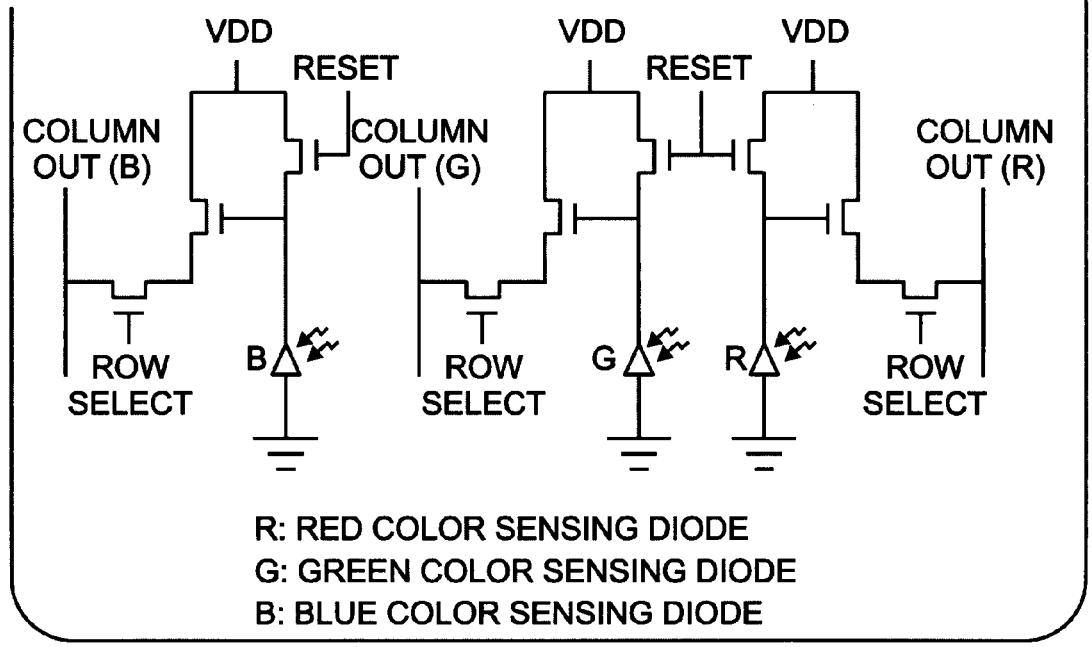
R: RED COLOR SENSING DIODE
G: GREEN COLOR SENSING DIODE
B: BLUE COLOR SENSING DIODE

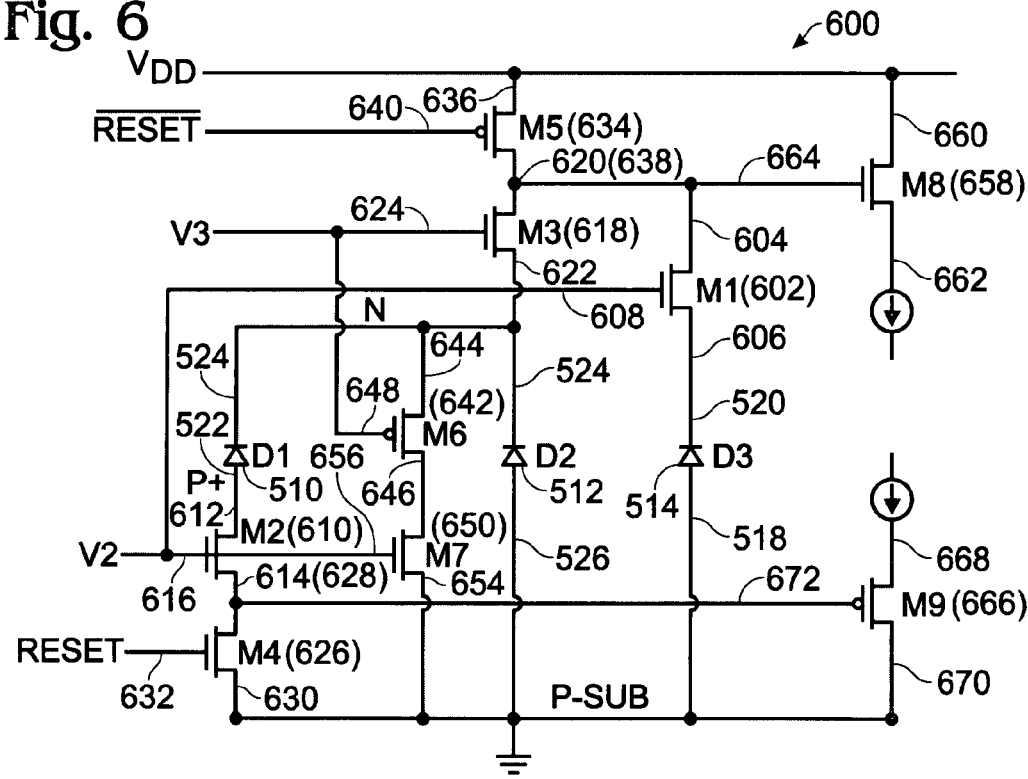
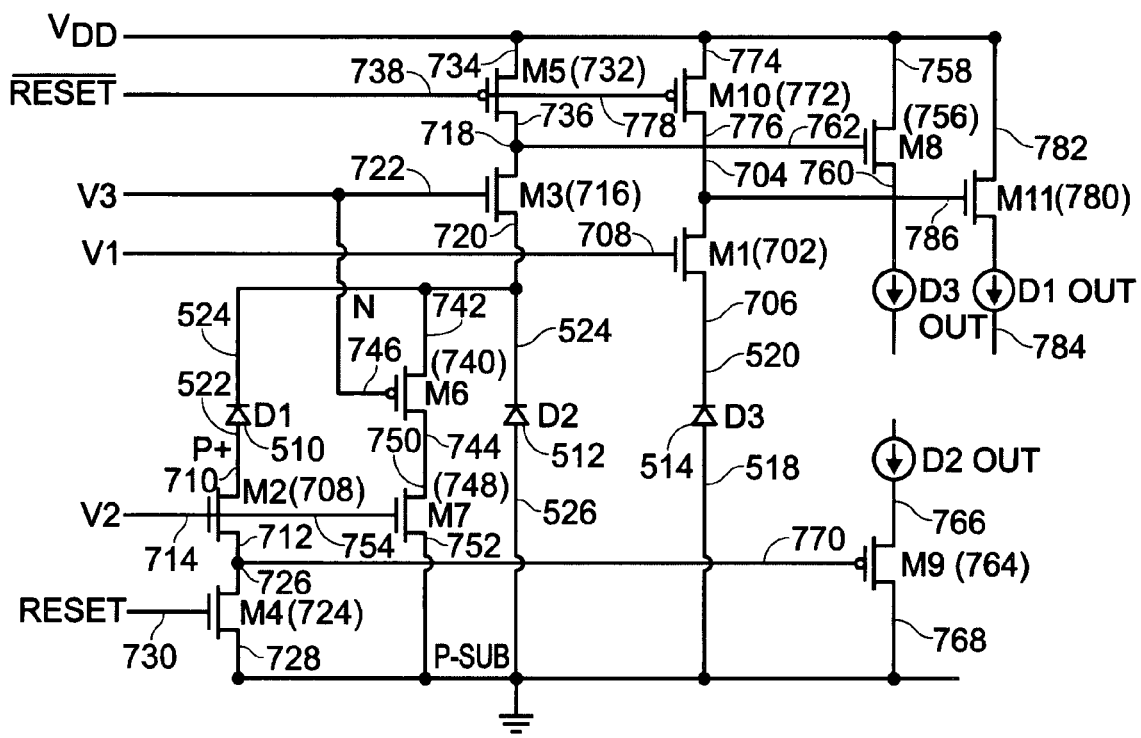

METHOD FOR INDEPENDENTLY DETECTING SIGNALS IN A DOUBLE-JUNCTION FILTERLESS CMOS COLOR IMAGER CELL

RELATED APPLICATIONS

This application is a Divisional of a pending patent application entitled, DOUBLE-JUNCTION FILTERLESS CMOS COLOR IMAGER CELL, invented by Hsu et al., Ser. No. 11/499,081, filed Aug. 4, 2006, which is a Continuation-in-part of the following two applications:

a pending patent application entitled, A REAL-TIME CMOS IMAGER HAVING STACKED PHOTODIODES FABRICATED ON SOI WAFER, invented by Lee et al., Ser. No. 11/384,110, filed Mar. 17, 2006, which is incorporated herein by reference; and, a pending patent application entitled, WIDE OUTPUT SWING CMOS IMAGER, invented by Lee et al., Ser. No. 11/416,742, filed May 3, 2006. All three of the above-mentioned applications are incorporated herein by reference.

BACKGROUND OF THE INVENTION

1. Field of the Invention

This invention generally relates complementary metal/oxide/semiconductor (CMOS) imaging sensors and, more particularly, to an imager pixel transistor set for reading signals from double junction photodiodes formed in a silicon substrate.

2. Description of the Related Art

FIG. 1 is a schematic diagram depicting an active pixel sensor (APS) imager cell made with n-channel MOS (NMOS) transistors (prior art). The APS cell includes a reset transistor, source follower transistor, select transistor, and a photodiode. All three transistors in the APS cell are NMOS. The drain and source terminals of the reset transistor are respectively coupled to a reference supply ($V_{Ref}$) and a cathode (node 1) of photodiode, whose anode is coupled to a ground or fixed reference voltage ($V_{SS}$). The source terminal of reset transistor drives the gate terminal of source follower transistor, whose drain and source terminals are coupled, respectively, to a power supply ($V_{DD}$) and drain terminal of the select transistor. The reference supply ($V_{Ref}$) may be, but need not be, equal to the power supply ($V_{DD}$). During operation, a high reset voltage ($V_{Reset}$) is initially provided at the reset transistor to pull node 1 up to a dark reference voltage ($V_{Dark}$). If the active reset voltage is high enough to keep reset transistor in the linear region, the dark reference voltage $V_{Dark}$ equals $V_{Ref}$. When the reset voltage is turned off, the charge trapped at photodiode cathode (i.e., node 1) maintains a high voltage there. When the APS cell is exposed to light, the photodiode discharges node 1, to bring the voltage at node 1 towards the ground reference voltage. The voltage at node 1 can be read by turning on the select transistor, which is done by applying a selection voltage to the gate terminal of the select transistor, and sensing the output voltage $V_{Out}$. For an undischarged pixel, voltage $V_{Out}$ is given by:

$$V_{Out} = V_{Dark} - V_{noise} - V_{TN}$$

where $V_{Dark}$ is the dark reference voltage at node 1, $V_{noise}$ represents a reset noise, and $V_{TN}$ is the threshold voltage for source follower transistor.

FIG. 2A is a schematic diagram depicting a bulk silicon (Si) six-transistor (6T) stacked junction imager cell (prior art). The 6T cell includes the 3T cell of FIG. 1, plus additional transfer transistors.

FIG. 2B is a partial cross-sectional view of a stacked set of photodiodes formed in a Si-on-insulator (SOI) substrate (prior art). The photodiode set 200 includes three stacked photodiodes 202, 204, and 206. Note, none of the photodiodes share a junction. That is, the p-doped and n-doped areas of the three diodes are distinct and separate. The photodiode set is controlled by a transistor set, such as the set shown in FIG. 2A or FIG. 3, which is represented in this figure by transistor 208.

FIG. 3 is a schematic diagram depicting a bulk Si nine-transistor (9T) stacked junction imager cell (prior art). The 9T cell includes three of the 3T cells of FIG. 1. Stacked photo-detectors are used for color imaging, one diode for each of the red (R), green (G), and blue (B) colors. A stacked RGB photodiode can directly measure red, green, and blue signals by efficiently stacking three photodiodes on top of one another using a triple-well CMOS process wherein the blue, green, and red sensitive pn junctions are disposed at different depths beneath the surface of a semiconductor substrate upon which the imager is formed (see FIG. 2B). This technology increases the sampling density, improves sharpness, and eliminates the color aliasing artifacts. Further, this technology does not require color filters.

FIGS. 4A and 4B depict a silicon-on insulator (SOI) version of a multi-junction filterless color imager (prior art). The blue diode D1 is fabricated at SOI top silicon film. The green diode is the P+N diode and the red diode are the N-P-substrate diode. The structure is very simple. The APS circuit is shown in FIG. 4B where the red diode output is read at M5. The source follower, M6, reads a differential signal responsive to both the red and green photodiode. There is no direct green diode read out capability. The blue diode is fabricated SOI top Si layer and the APS circuit of the blue diode is a conventional unit as is shown in FIG. 1.

It would be advantageous if a multi-junction photodiode imager could be enabled with an imager sensing transistor set to independently read the output of each photodiode.

SUMMARY

This present invention provides a simple imager sensing circuit for an SOI version of multi-junction color imager. The blue, green, and red diode outputs can each be read separately, independent of the other outputs. The fabrication of the imager cell is simple and does not require an epitaxial process.

Accordingly, a double junction complimentary metal-oxide-semiconductor (CMOS) filterless color imager cell is provided. The imager cell is fabricated from a silicon-on-insulator (SOI) substrate including a silicon (Si) substrate, a silicon dioxide insulator overlying the substrate, and a Si top layer overlying the insulator. A photodiode set is formed in the SOI substrate, including a first and second photodiode formed as a double-junction structure in the Si substrate. A third photodiode is formed in the Si top layer. A (imager sensing) transistor set is formed in the top Si layer. The transistor set is connected to the photodiode set and detects an independent output signal for each photodiode.

Specifically, the third photodiode includes a pn junction formed from a p–doped top Si layer, to an overlying n+doped region. The double-junction structure includes the first photodiode forming as a pn junction from a p-doped (p+) region underlying the SOI insulator, to an underlying n-doped well (n-well). The second photodiode forms a pn junction from a p–doped substrate to the overlying n-well. A double-junction set of diodes are formed since the first and second photodiodes share a common junction (the n-well).

The transistor set may be an eight-transistor (8T), a nine-transistor (9T), or an eleven-transistor (11T) cell. Specific details of the above-mentioned transistor cells are provided below. Details of a method for independently detecting signals from a double junction CMOS color imager cell are also provided.

BRIEF DESCRIPTION OF THE DRAWINGS

FIG. 2B is a partial cross-sectional view of a stacked set of photodiodes formed in a Si-on-insulator (SOI) substrate (prior art).

FIG. 3 is a schematic diagram depicting a bulk Si nine-transistor (9T) stacked junction imager cell (prior art).

FIG. 6 is a schematic block diagram of the transistor set of FIG. 5 enabled as a 9T cell.

FIG. 7 is a schematic block diagram of the transistor set of FIG. 5 enabled as an 11T cell.

DETAILED DESCRIPTION

Figure 5:
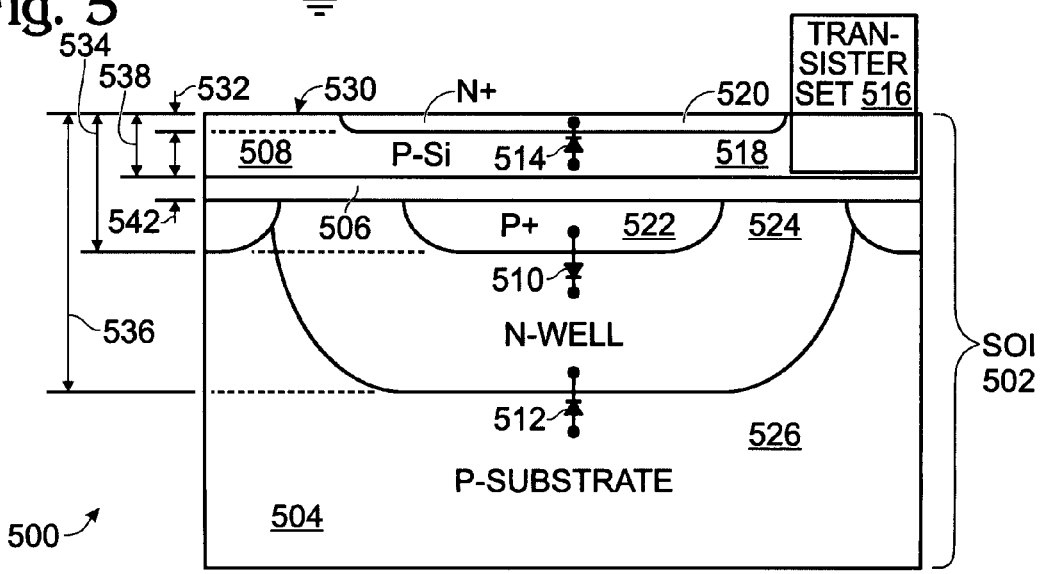
FIG. 5 is a partial cross-sectional view of a double junction complimentary metal-oxide-semiconductor (CMOS) filterless color imager cell.

FIG. 5 is a partial cross-sectional view of a double-junction complimentary metal-oxide-semiconductor (CMOS) filterless color imager cell. The imager cell 500 comprises a silicon-on-insulator (SOI) substrate 502 including a silicon (Si) substrate 504, a silicon dioxide insulator 506 overlying the substrate 504, and a Si top layer 508 overlying the insulator 506. A photodiode set is formed in the SOI substrate 502 including a first photodiode 510 and a second photodiode 512 formed as a double-junction structure in the Si substrate 504. The structure is termed a double-junction because the first photodiode 510 and second photodiode 512 share a common pn junction in the n-well, as described in more detail below. A third photodiode 514 formed in the Si top layer 508. A transistor set 516 is formed in the top Si layer 508. The transistor set 516 is connected to the photodiode set (photodiodes 510, 512, and 514), and detects an independent output signal for each photodiode. The transistor set 516 connections to the photodiodes are shown in subsequent figures. The transistor set 516 may be an eight-transistor (8T), a nine-transistor (9T), or an eleven-transistor (11T) cell.

The third photodiode 514 includes a pn junction formed from a p-doped top Si layer 518, to an overlying n+doped region 520. Although the Si top layer 508 is shown as p-doped (518), in other aspects not shown, the region 518 is formed in selected areas of an undoped, or alternatively doped top Si layer 508. The double-junction structure includes the first photodiode 510 formed as a pn junction from a p-doped (p+) region 522 underlying the SOI insulator 506, to an underlying n-doped well (n-well) 524. The second photodiode 512 forms a pn junction from a p-doped substrate 526 to the overlying n-well 524. As shown, the entire substrate 504 is p–doped, so that reference designators 504 and 526 refer to the same region. However, in other aspects not shown, the p–doped region 526 is a local region formed in a portion of an undoped, or alternatively doped Si substrate 504.

In one aspect, the SOI Si top layer 508 has a top surface 530. Then, the third photodiode 514 pn junction has a depth 532 about 0.1 to 0.5 micrometers (μm) beneath the SOI Si top layer top surface 530. Typically, the Si top layer 508 has an overall thickness 538 of about 0.3 to 1 um. This depth is associated with the sensing of blue light. The first photodiode 510 pn junction has an effective depth 534 about 0.5 to 1.5 μm beneath the SOI Si top layer top surface 530, and is associated with the sensing of green light. "Effective depth" is defined herein as the depth beneath top surface 530, after the thickness of the SiO2 layer 506 is subtracted from the total depth. The SiO2 layer 506 has a thickness 542 of about 0.02 to 1 um, and its thickness can be subtracted from the effective depth because it is transparent to visible spectrum light. The thickness 538 of the Si top layer 508, however, acts as a color filter. The second photodiode 512 pn junction has an effective depth 536 about 1.5 to 6 μm beneath the SOI Si top layer top surface 530, and is associated with sensing red light. A CMOS APS imager may be made up of thousands of APS imager cells arranged in a matrix structure.

FIG. 6 is a schematic block diagram of the transistor set 516 of FIG. 5 enabled as a 9T cell. The 9T cell 600 includes a first (NMOS) transistor 602 (M1) with a first source/drain (S/D) region 604, a second S/D region 606 connected to the third photodiode top Si layer n+doped region 520, and a gate 608 connected to a second select line (V2). A second (NMOS) transistor 610 (M2) has a first S/D region 612 connected to the Si substrate p+ region 522, a second S/D region 614, and a gate 616 connected to a second select line (V2).

A third (NMOS) transistor 618 (M3) has a first S/D region 620 connected to the M1 first S/D region 604, a second S/D region 622 connected to the Si substrate n-well 524, and a gate 624 connected to a third select line (V3). A fourth (NMOS) transistor 626 (M4) has a first S/D region 628 connected to the M2 second S/D region (614), a second S/D region 630 connected to the Si substrate p-substrate 526. That is, the second S/D region 630 and Si substrate p-substrate 526 are both connected to a reference voltage (e.g., ground). The M4 transistor 626 has a gate 632 connected to a reset line.

A fifth (PMOS) transistor 634 (M5) has a first S/D region 636 connected to a supply voltage (Vdd), a second S/D region 638 connected to the M1 first S/D 604, and a gate 640 connected to a complementary reset line. Note, the supply voltage has a higher voltage potential than the reference voltage. A sixth (PMOS) transistor 642 (M6) has a first S/D region 644 connected to the Si substrate n-well 524, a second S/D region 646, and a gate 648 connected to the third select line (V3). A seventh (NMOS) transistor 650 (M7) has a first S/D region 652 connected to the M6 second S/D region 646, a second S/D region 654 connected to the Si substrate p- substrate 526 (via the reference voltage), and a gate 656 connected to the second select line (V2). An eighth (NMOS) transistor 658 (M8) has a first S/D region 660 to the supply voltage (Vdd), a second S/D region 662 to supply independent second and third photodiode output signals, and a gate 664 connected to the M1 first S/D region 604. A ninth (PMOS) transistor 666 (M9) has a first S/D region 668 to supply the first photodiode output signal, a second S/D region 670 connected to the Si substrate p-substrate 526 (reference voltage), and a gate 672 connected to the M2 second S/D region 614.

FIG. 7 is a schematic block diagram of the transistor set 516 of FIG. 5 enabled as an 11T cell. The 11T cell 700 has a first (MOS) transistor 702 (M1) with a first source/drain (S/D) region, a second S/D region 704 connected to the third photodiode top Si layer n+ doped region 520, and a gate 706 connected to a first select line (V1). A second (NMOS) transistor 708 (M2) has a first S/D region connected to the Si substrate p+ region 522, a second S/D region 712, and a gate 714 connected to a second select line (V2).

A third (NMOS) transistor 716 (M3) has a first S/D region 718, a second S/D region 720 connected to the Si substrate n-well 524, and a gate 722 connected to a third select line (V3). A fourth (NMOS) transistor 724 (M4) has a first S/D region 726 connected to the M2 second S/D region 712, a second S/D region 728 connected to the Si substrate p-substrate 526 (via the reference voltage), and a gate 730 connected to a reset line. A fifth (PMOS) transistor 732 (M5) has a first S/D region 734 connected to a supply voltage (Vdd), a second S/D region 736 connected to the M3 first S/D 718, and a gate 738 connected to a complementary reset line.

A sixth (PMOS) transistor 740 (M6) has a first S/D region 742 connected to the Si substrate n-well 524, a second S/D region 744, and a gate 746 connected to the third select line (V3). A seventh (NMOS) transistor 748 (M7) has a first S/D region 750 connected to the M6 second S/D region 744, a second S/D region 752 connected to the Si substrate p-substrate (reference voltage), and a gate 754 connected to the second select line (V2). An eighth (NMOS) transistor 756 (M8) has a first S/D region 758 connected to the supply voltage (Vdd), a second S/D region 760 to supply the second photodiode output signal, and a gate 762 connected to the M3 first S/D region 718.

An ninth (PMOS) transistor 764 (M9) has a first S/D region 766 to supply the first photodiode output signal, a second S/D region 768 connected to the Si substrate p-substrate 526 (reference voltage), and a gate 770 connected to the M4 first S/D region. A tenth (PMOS) transistor 772 (M10) has a first S/D region 774 connected to the supply voltage (Vdd), a second S/D region 776 connected to the M1 first S/D region 704, and a gate 778 connected to the complementary reset. An eleventh (NMOS) transistor 780 (M11) has a first S/D region 782 connected to the supply voltage (Vdd), a second S/D region 784 to supply the third photodiode output signal, and a gate 786 connected to the M1 first S/D region 704.

Figure 8:
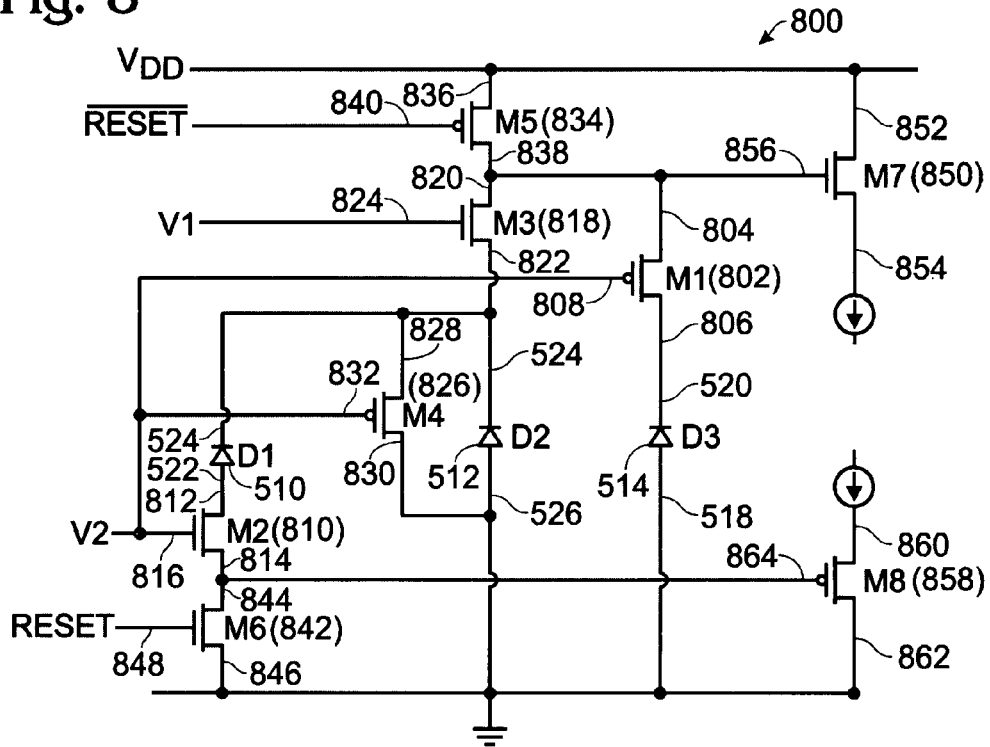
FIG. 8 is a schematic block diagram of the transistor set of FIG. 5 enabled as an 8T cell.

FIG. 8 is a schematic block diagram of the transistor set 516 of FIG. 5 enabled as an 8T cell. The 8T cell 800 includes a first (NMOS) transistor 802 (M1) with a first source/drain (S/D) region 804, a second S/D region 806 connected to the third photodiode top Si layer n+ doped region 520, and a 808 gate connected to a second select line (V2). A second (NMOS) transistor 810 (M2) has a first S/D region 812 connected to the Si substrate p+ region 522, a second S/D region 814, and a gate 816 connected to a second select line (V2).

A third (NMOS) transistor 818 (M3) has a first S/D region 820 connected to the M1 first S/D region 804, a second S/D region 822 connected to the Si substrate n-well 524, and a gate 824 connected to a first select line (V1). A fourth (NMOS) transistor 826 (M4) has a first S/D region 828 connected to the Si substrate n-well 524, a second S/D region 830 connected to the Si substrate p-substrate 526, and a gate 832 connected to the second select line (V2).

A fifth (PMOS) transistor 834 (M5) has a first S/D region 836 connected to a supply voltage (Vdd), a second S/D region 838 connected to the M1 first S/D region 804, and a gate 840 connected to a complementary reset line. A sixth (NMOS) transistor 842 (M6) has a first S/D region 844 connected to the M2 second S/D region 814, a second S/D region 846 connected to the Si substrate p-substrate 526 (via the reference voltage), and a gate 848 connected to a reset line.

A seventh (NMOS) transistor 850 (M7) has a first S/D region 852 connected to the supply voltage, a second S/D region 854 to supply independent second and third photodiode output signals, and a gate 856 connected to the M1 first S/D region 804. An eighth (PMOS) transistor 858 (M8) has a first S/D region 860 to the supply the first photodiode output signal, a second S/D region 862 connected to the Si substrate p-substrate 526 (via the reference voltage), and a gate 864 connected to the M6 first S/D region 844.

Functional Description

Figure 9:
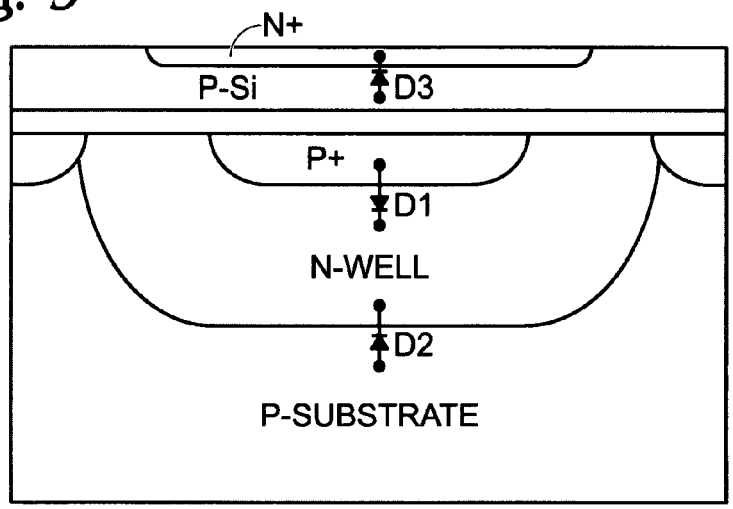
FIG. 9 is a partial cross-sectional simplified view of the multi-junction SOI color imager of FIG. 5.

FIG. 9 is a partial cross-sectional simplified view of the multi-junction SOI color imager of FIG. 5. D3 is the blue diode fabricated on the top silicon film. Diodes D1 and D2 are a green and red diodes, respectively. An exemplary fabrication process for this structure is as follows:

1. Clean wafers.
2. Photoresist cover the field region.
3. Phosphorus ion implantation to dope the N-well. Energy is 50 KeV to 150 KeV, dosage is $5 \times 10^{13}/cm^2$ to $5 \times 10^{14}/cm^2$.
4. Strip resist and N-well diffusion at temperature 1000° C. to 1200° C. for 1 to 3 hours.
5. Photoresist open the P+ junction region and field area.
6. Boron ion implantation to form P+ region. The energy is 10 KeV to 30 KeV, and the dosage is $5 \times 10^{14}/cm^2$ to $2 \times 10^{15}/cm^2$.
7. N+ contact photo and Ar ion implantation. Ar energy is from 30 keV to 60 keV, and dosage is from $3 \times 10^{14}/cm^2$ to $5 \times 10^{15}/cm^2$.
8. Etch and clean wafers.
9. Wafer oxidation, to grow 10 nanometers (nm) to 300 nm of oxide.
10. Prepare donor wafer with 10 nm to 100 nm of thermal oxide.
11. Hydrogen, argon, helium, or neon ion implantation energy to generate high defect density in donor wafer at 0.5 micrometers (μm) to 1 μm below surface.
12. Bond donor wafer to handle wafer. Split donor wafer.
13. CMP to smooth and thin the top silicon layer to the desired thickness.
14. Fabricate the APS cell transistors on top silicon film to complete p-MOS and n-MOS without N+ source/drain ion implantation.
15. Arsenic ion implantation to form n-MOS source/drain and N+ junction of D3. Ar ion energy is 30 keV to 60 KeV. The ion dose is $5 \times 10^{14}/cm^2$ to $2 \times 10^{15}/cm^2$.
16. Passivation and Metallization Steps 8 through 12 may be replaced with any state-of-the-art wafer bonding process.

The APS circuit diagram is shown FIGS. 6-8, and explained above, all use both n-channel (NMOS) and p-channel (PMOS) transistors. Since all active transistors are fabricated on the top silicon film of the SOI wafer, simple island isolation, with a minimum island-to-island distance can be used.

Figure 10:
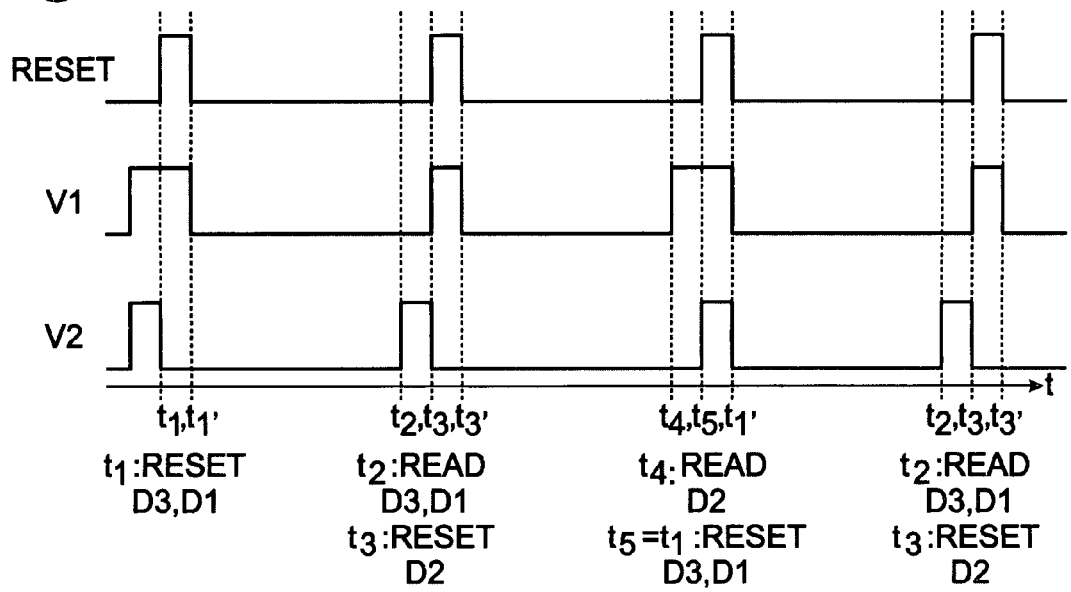
FIG. 10 is an imager cell pulse timing diagram associated with the 8T transistor set of FIG. 8.

FIG. 10 is an imager cell pulse timing diagram associated with the 8T transistor set of FIG. 8. M7 is the sensing transistor for blue diode D3, and red diode D2. M8 is the sensing transistor for green diode D1. When the reset pulse is on, transistors M5 and M6 are turned on. When voltage V1 is on the transistor M3 is on. The voltage V2 turns on the transistors M1, M2, and M4. At time $t_1$, Reset, V1, and V2 are all on. Transistors M1 through M6 are all turned on. Transistor M4 shorts circuit diode D2. Both diodes D3 and D1 are set to $V_{DD}$ after the reset. The pulse is off at $t_1'$, and diodes D3 and D1 start to integrate the photon generated charges. V2 is pulsed at $t_2$. The cathode of D1 is grounded through M4. Photon generated charges at D3 and D1 are read out through M7 and M8, respectively. At time $t_3$, V2 is off, and Reset and V1 are on. This action resets diode D2. At time $t_3'$, V1, V2, and Reset pulses are off. Transistor M4 is off. Diode D2 starts to integrate photon generated charges. V1 is on and at $t_4$ when the photon generated charge at D2 is read out through M7. At time $t_5$ the color imager cell sensing cycle is completed, and returns to time $t_1$. Reset, V1, and V2 are on and start a new operation cycle.

Figure 1:
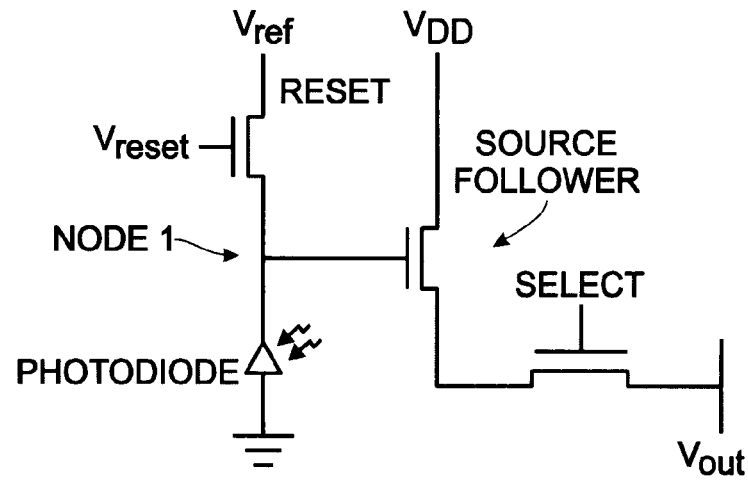
FIG. 1 is a schematic diagram depicting an active pixel sensor (APS) imager cell made with n-channel MOS (NMOS) transistors (prior art).
Figure 2A:
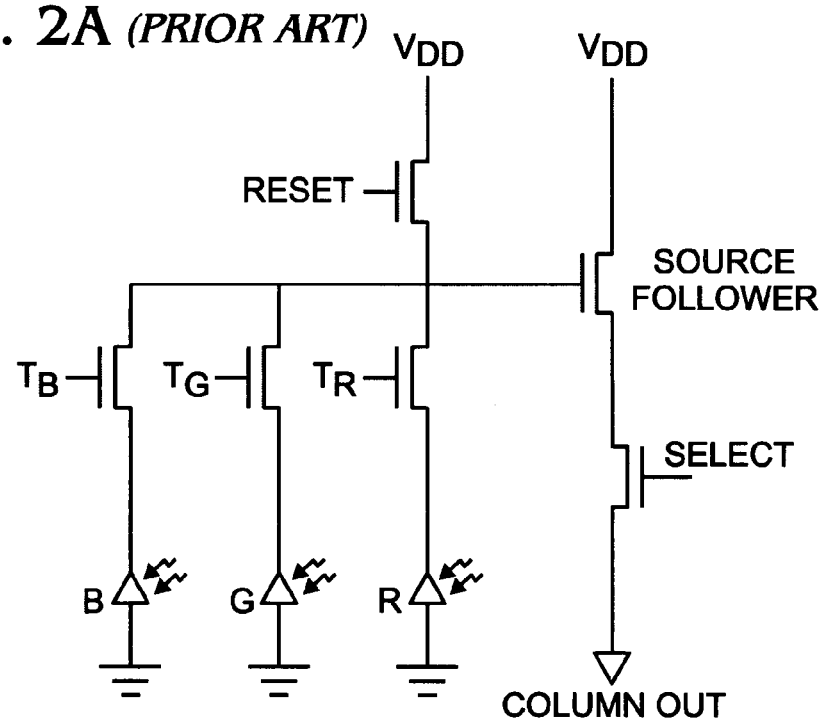
FIG. 2A is a schematic diagram depicting a bulk silicon (Si) six-transistor (6T) stacked junction imager cell (prior art).
Figure 4A:
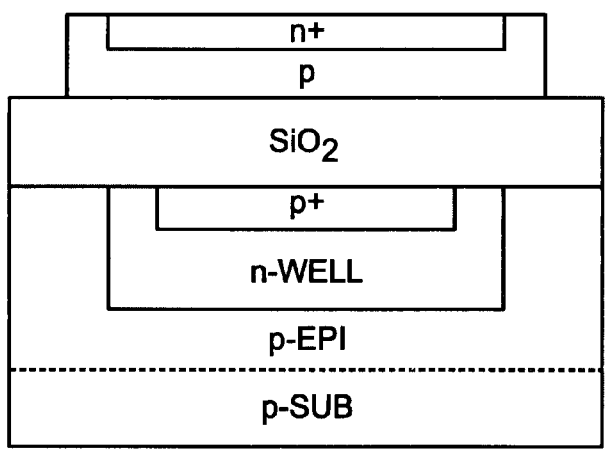
FIGS. 4A and 4B depict a silicon-on insulator (SOI) version of a multi-junction filterless color imager (prior art).
Figure 4B:
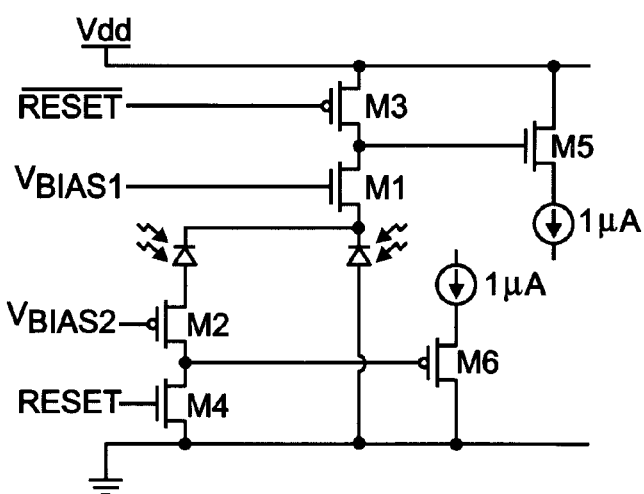
Figure 11:
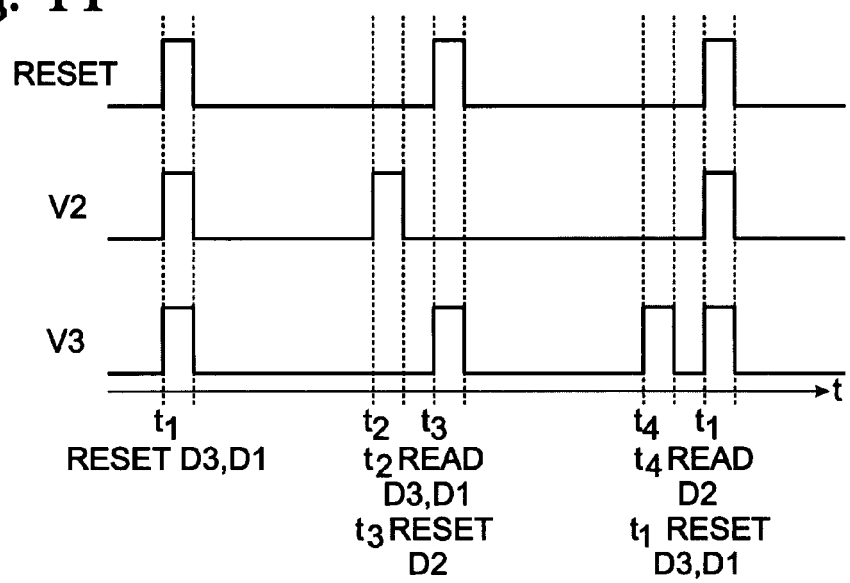
FIG. 11 is an imager cell pulse timing diagram associated with the 9T transistor set of FIG. 6.

FIG. 11 is an imager cell pulse timing diagram associated with the 9T transistor set of FIG. 6. M8 is the sensing transistor for blue diode, D3 and red diode D2. M9 is the sensing transistor for green diode, D1. The N-well is grounded through transistors M6 and M7 during green and blue diode readout. Therefore, the actual voltage of the green diode can be read. The prior art process (FIGS. 4A and 4B) must read the sum of the voltages for the green diode D1 and red diode D2.

Since D3 is SOI diode, which is isolated from the green and the red diodes D1 and D2, D3 is reset when the reset pulse and V2 are on. The green diode D1 is reset when reset pulse, V2, and V3 are on (M7 is on and M6 is off). The red diode D2 is reset when reset pulse is on and V3 is on.

At time $t_1$, Reset, V2, and V3 are all on. Transistors M1 through M5, and M7 are turned on, while transistor M6 is off. This resets both diodes, D3 and D1. At $t_2$, V2 is on. M1, M2, M6, and M7 are on. Therefore, the voltage of D3 and D1 are readout through M8 and M9, respectively. During $t_3$, both reset and V3 are on. M5, M3, and M6 are off. The red diode D2 is reset to $V_{DD}$. At $t_4$, V3 is on. The transistor M3 is turned on. All other transistors are off. The transistor M8 reads the voltage of D2. This completes the one read cycle.

Figure 12:
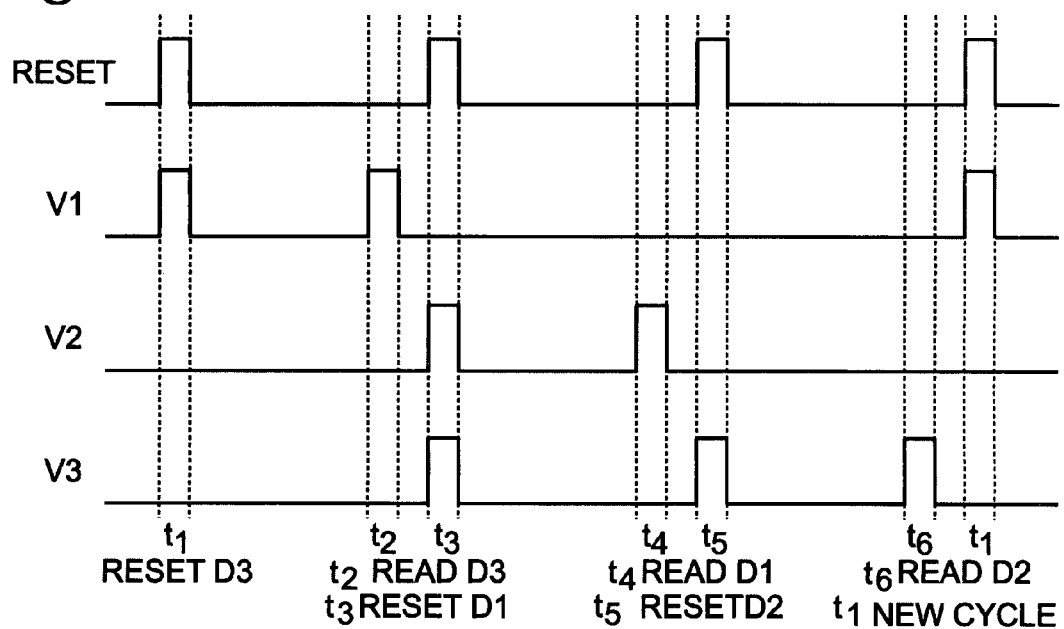
FIG. 12 is an imager cell pulse timing diagram associated with the 11T transistor set of FIG. 6.

FIG. 12 is an imager cell pulse timing diagram associated with the 11T transistor set of FIG. 7. As compared to the circuit of FIG. 6, the input of transistor M1 is separated from that of M2, and is powered by V1. Also, the M1 transistor is connected through an additional reset PMOST, M10 to the power supply $V_{DD}$. There is also an independent output transistor of M11. When reset and V1 are on, the blue diode D3 is reset to $V_{DD}$. At time $t_2$, V1 is on, and the voltage of the blue diode is read out through M11. The timing and the read out of green and red diodes are identical to that of FIG. 11.

Figure 13:
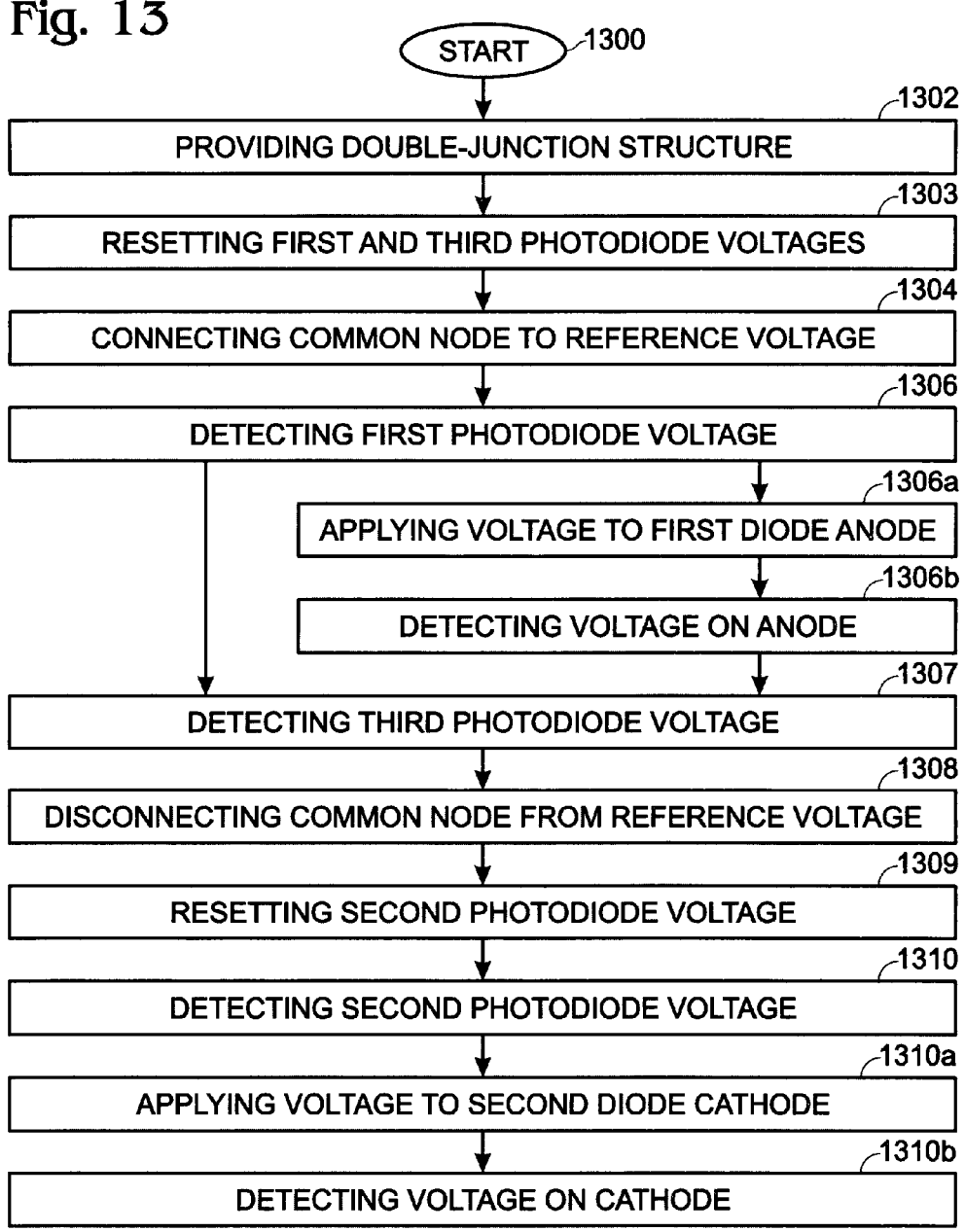
FIG. 13 is a flowchart illustrating a method for independently detecting signals from a double-junction CMOS color imager cell.

FIG. 13 is a flowchart illustrating a method for independently detecting signals from a double junction CMOS color imager cell. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1300.

Step 1302 provides a silicon (Si) substrate with a double-junction structure of first and second photodiodes sharing a common node. Step 1304 selectively connects the common node to a reference voltage (e.g., ground). Step 1306 detects the first photodiode voltage. Step 1308 selectively disconnects the common node from the reference voltage. Step 1310 detects the second photodiode voltage.

In one aspect, providing the double-junction structure in Step 1302 includes providing first and second photodiodes sharing a common cathode, with an anode of the second photodiode connected to the reference voltage. Then, selectively connecting the common node to the reference voltage in Step 1304 includes connecting the cathodes of the first and second photodiodes to the reference voltage. In one aspect, providing the double-junction structure in Step 1302 includes providing the first photodiode pn junction having a p–doped (p+) region with an underlying n-doped well (n-well), and providing the second photodiode pn junction having a p–doped substrate to the overlying n-well.

In another aspect, detecting the first photodiode voltage in Step 1306 includes substeps. Step 1306a, subsequent to connecting the first and second photodiode cathodes to the reference voltage, applies a voltage to the first photodiode anode. Step 1306b detects the voltage on the first photodiode anode. Detecting the second photodiode voltage in Step 1310 includes substeps. Step 1310a, subsequent to disconnecting the second photodiode cathode from the reference voltage, applies a voltage to the second photodiode cathode. Step 1310b detects the voltage on the second photodiode cathode.

In a different aspect, providing the double junction structure additional in Step 1302 includes providing a SOI substrate with the first and second photodiodes formed in the SOI substrate, and a third photodiode formed in a SOI top Si layer. Then, Step 1307 detects a third photodiode voltage.

In one aspect, Step 1303 resets the first and third photodiode voltages. Then, detecting the first photodiode voltage (Step 1306) and detecting the third photodiode voltages (Step 1307) includes simultaneously detecting the first and third photodiode voltages subsequent to resetting the first and third photodiode voltages (Step 1303). That is, Step 1306 and 1307 are performed at the same time. However, the detection of the first photodiode voltage is independent of the detection of the third photodiode voltage.

Step 1309 resets the second photodiode voltage subsequent to detecting the first and third photodiode voltages. Then, detecting the second photodiode voltage in Step 1310 includes detecting the second photodiode voltage independent of detecting the first and third photodiode voltages.

In another aspect, detecting the third photodiode voltage in Step 1307 includes detecting a signal associated with the detection of a blue light spectrum. Step 1306 detects a signal associated with the detection of a green light spectrum, and Step 1310 detects a signal associated with the detection of a red light spectrum.

A multi-junction CMOS imager cell, fabricated on a SOI substrate, has been presented. 8T, 9T, and 11T transistor sets have been described that permit three photodiode voltages to be read independent of each other. However, the invention is not limited to merely these examples. It will be appreciated that further variations and modifications thereof may be made within the scope of the invention as defined in the appended claims.

We claim:

1. A method for independently detecting signals from a double-junction complimentary metal-oxide-semiconductor (CMOS) color imager cell, the method comprising:

providing a silicon (Si) substrate with a double-junction structure of first and second photodiodes sharing a common node;

selectively connecting the common node to a reference voltage;

reading a first photodiode voltage;

selectively disconnecting the common node from the reference voltage;

reading a second photodiode voltage;

wherein providing the double-junction structure includes providing first and second photodiodes sharing a common cathode, with an anode of the second photodiode connected to the reference voltage; and, wherein selectively connecting the common node to a reference voltage includes connecting the cathodes of the first and second photodiodes to the reference voltage.

2. The method of claim 1 wherein reading the first photodiode voltage includes:

subsequent to connecting the first and second photodiode cathodes to the reference voltage, applying a voltage to the first photodiode anode; and, reading the voltage on the first photodiode anode; and, wherein reading the second photodiode voltage includes:

subsequent to disconnecting the second photodiode cathode from the reference voltage, applying a voltage to the second photodiode cathode; and, reading the voltage on the second photodiode cathode.

3. The method of claim 1 wherein providing the double-junction structure includes providing the first photodiode pn junction between a p-doped (p+) region and an n-doped well (n-well) underlying the p-doled region, and providing the second photodiode pn junction between a p-doped substrate and the n-well overlying the p-doped substrate.

4. The method of claim 1 wherein providing the double-junction structure additionally includes providing a Si-on-insulator (SOI) substrate with the first and second photodiodes formed in the SOI substrate, and a third photodiode formed in a SOI top Si layer; and, the method further comprising:

reading a third photodiode voltage.

5. The method of claim 4 further comprising:

resetting the first and third photodiode voltages; and, where reading the first and third photodiode voltages includes:

subsequent to resetting the first and third photodiode voltages, simultaneously reading the first and third photodiode voltages; and, reading the first photodiode voltage independent of detecting the third photodiode voltage.

6. The method of claim 5 further comprising:

subsequent to reading the first and third photodiode voltages, resetting the second photodiode voltage; and, wherein reading the second photodiode voltage includes reading the second photodiode voltage independent of reading the first and third photodiode voltages.

7. The method of claim 4 wherein reading the third photodiode voltage includes reading a signal associated with the detection of a blue light spectrum;

wherein reading the first photodiode voltage includes reading a signal associated with the detection of a green light spectrum; and, wherein reading the second photodiode voltage includes reading a signal associated with the detection of a red light spectrum.

* * * * *